(12) United States Patent
Chan et al.

(10) Patent No.: US 10,439,430 B2
(45) Date of Patent: Oct. 8, 2019

(54) DISTRIBUTED BATTERY MANAGEMENT SYSTEM

(71) Applicant: Contemporary Amperex Technology Co., Limited, Ningde, Fujian (CN)

(72) Inventors: Libing Chan, Ningde (CN); Yang Gao, Ningde (CN); Lijuan Liu, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 159 days.

(21) Appl. No.: 15/671,101

(22) Filed: Aug. 7, 2017

(65) Prior Publication Data

US 2018/0048182 A1 Feb. 15, 2018

(30) Foreign Application Priority Data

Aug. 10, 2016 (CN) .......................... 2016 1 0649544

(51) Int. Cl.
| | | |
|---|---|---|
| *H01M 10/46* | (2006.01) | |
| *H02J 9/06* | (2006.01) | |
| *G01R 31/382* | (2019.01) | |
| *G01R 31/396* | (2019.01) | |
| *G06F 11/30* | (2006.01) | |
| *H01M 10/42* | (2006.01) | |

(Continued)

(52) U.S. Cl.
CPC ................ *H02J 9/061* (2013.01); *B60L 3/12* (2013.01); *B60L 58/10* (2019.02); *G01R 31/382* (2019.01); *G01R 31/396* (2019.01); *G06F 11/3065* (2013.01); *H01M 10/4207* (2013.01); *H02J 1/02* (2013.01); *H02J 1/06* (2013.01); *H02J 3/32* (2013.01); *H02J 7/0026* (2013.01); *H02J 7/34* (2013.01); *H01M 2220/10* (2013.01); *Y02T 10/7005* (2013.01); *Y02T 10/705* (2013.01); *Y02T 10/7055* (2013.01); *Y02T 90/16* (2013.01)

(58) Field of Classification Search
CPC ........ H02J 7/0004; H02J 7/355; H02J 7/0042; H02J 2007/006
USPC .................................. 320/107, 114, 116, 119
See application file for complete search history.

(56) References Cited

U.S. PATENT DOCUMENTS 8,933,671 B2 * 1/2015 Lee ......................... B60L 58/12
320/135
2015/0280464 A1 10/2015 Kang et al.

FOREIGN PATENT DOCUMENTS

| CN | 201426046 Y | 3/2010 |
|---|---|---|
| CN | 103904724 A | 7/2014 |

(Continued)

OTHER PUBLICATIONS

Extended European Search Report for European Application No. 17185493.8, dated Dec. 14, 2017.

(Continued)

*Primary Examiner* — Edward Tso
(74) *Attorney, Agent, or Firm* — Law Offices of Liaoteng Wang

(57) ABSTRACT

The present disclosure relates to a distributed battery management system. The system includes a master module and at least one slave module. Each slave module manages a corresponding of battery pack connected in series in a power circuit. The master module and each slave module are respectively connected in the power circuit, and the master module can communicate with the slave module through the power circuit with two opposite directions.

8 Claims, 2 Drawing Sheets

(51) Int. Cl.
*H02J 1/02* (2006.01)
*H02J 1/06* (2006.01)
*H02J 3/32* (2006.01)
*H02J 7/34* (2006.01)
*B60L 3/12* (2006.01)
*H02J 7/00* (2006.01)
*B60L 58/10* (2019.01)

(56) References Cited

FOREIGN PATENT DOCUMENTS

| | | |
|---|---|---|
| CN | 104276048 A | 1/2015 |
| CN | 104908600 A | 9/2015 |
| CN | 105162215 A | 12/2015 |
| EP | 2789509 A1 | 10/2014 |
| WO | 2011/078478 A2 | 6/2011 |
| WO | 2013/125850 A1 | 8/2013 |
| WO | 2015/181866 A1 | 12/2015 |

OTHER PUBLICATIONS

The First Official Action and search report dated Apr. 9, 2019 for Chinese application No. 201610649544.X, 8 pages.

\* cited by examiner

DISTRIBUTED BATTERY MANAGEMENT SYSTEM

CROSS REFERENCE TO RELATED APPLICATION

The present application is based upon and claims the benefits of Chinese Patent Application No. CN 201610649544.X filed on Aug. 10, 2016, the entire contents of which are incorporated herein by reference.

TECHNICAL FIELD

The present disclosure relates to the field of power battery technology, and more particularly, to a distributed battery management system.

BACKGROUND

Since the national new energy promotion policy was implemented, pure electric commercial vehicle market continues to develop. A battery management system is one of key technologies related to practical use and commercialization of electric vehicles, so it has a great significance to research and develop battery management technologies and systems and to enable industrialization thereof.

At present, most pure electric vehicles are provided with a battery system including ten or more battery cases. Each battery case is equipped with a slave module of the battery management system. The slave modules are connected with each other by complicated low-voltage power supply and communication harnesses. In a case that the battery system has N battery cases, the connection between the master module and the slave modules requires more than N low-voltage connection harnesses and it also requires more than N connection nodes. A long-distance low-voltage trace results in a large voltage drop across the harness, and so many connection nodes may increase the risk of low-voltage harnesses and low-voltage connectors being loosen or damaged, which affects the battery management system's power supply and communication reliability. Moreover, a circuit, which has long distance, multiple nodes and high voltage, requires additional On-Off circuit detection and breaker point positioning.

SUMMARY

The present disclosure provides a distributed battery management system. The distributed battery management system includes a master module and at least one slave module. Each slave module manages a corresponding battery pack, the battery pack being connected in series in a power circuit. The master module and each slave module are respectively connected in the power circuit, and the master module can communicate with the slave module through the power circuits in two opposite directions.

In some embodiments, the slave module is powered by the corresponding battery pack managed by the slave module.

As an improvement of the distributed battery management system of the In some embodiments, the master module is connected to one end of every battery pack connected in series through a first switch of the master module, and the master module is connected to the other end of every battery pack connected in series through a second switch of the master module.

As an improvement of the distributed battery management system of the In some embodiments, each battery pack converts a high voltage to a low voltage through a DC/DC converter and outputs the low voltage to a corresponding slave module.

As an improvement of the distributed battery management system of the In some embodiments, the master module and the slave module may communicate by a power line communication technology.

As an improvement of the distributed battery management system of the In some embodiments, the master module and the slave module use a cable of the power circuit and an object with ground potential as communication media.

As an improvement of the distributed battery management system of the In some embodiments, the slave module and the corresponding battery pack are provided in a battery case, and the object with ground potential is the housing of the battery case.

As an improvement of the distributed battery management system of the In some embodiments, the slave module has a communication cable connected to the power circuit and another communication cable connected to the housing of the battery case.

As an improvement of the distributed battery management system of the In some embodiments, the slave module may be connected in the power circuit via a Programmable Logic Controller (PLC) modem.

As an improvement of the distributed battery management system of the In some embodiments, the master mode is provided in a master box, and the power circuit goes through the master box.

BRIEF DESCRIPTION OF THE DRAWINGS

The distributed battery management system and its beneficial technical effects of the present disclosure will now be described in details with reference to the accompanying drawings and specific embodiments.

DETAILED DESCRIPTION

The present disclosure will now be described in further details with reference to the accompanying drawings and specific embodiments in order to clarify the objects, technical solutions and technical effects of the present disclosure. It is to be understood that the specific embodiments described in this specification are merely for the purpose of explaining the invention and are not intended to limit the invention.

The distributed battery management system of the present disclosure includes a main control module and at least one slave module. Each slave module manages a corresponding battery pack, the battery pack being connected in series in a power circuit. The master module and each slave module are respectively connected in the power circuit, and the master module can communicate with the slave module through the power circuit with two opposite directions.

The following is an embodiment of the distributed battery management system of the present disclosure applied to a battery system of a pure electric vehicle.

Figure 1:
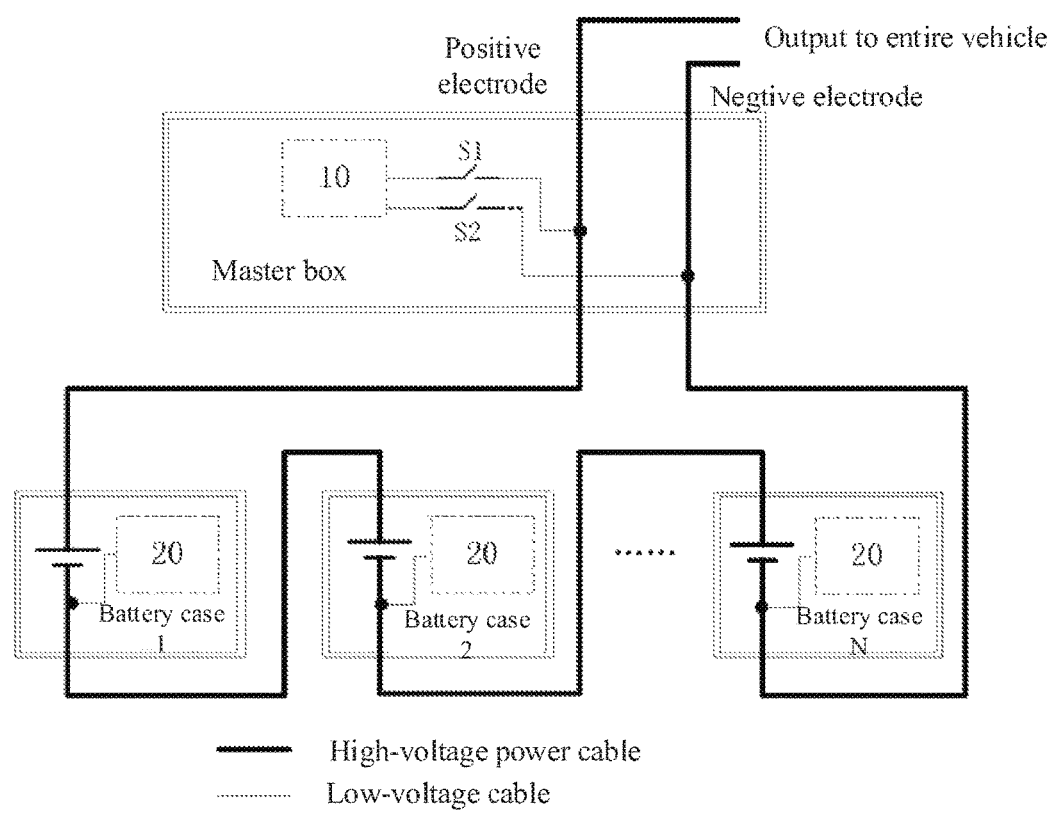
FIG. 1 is a schematic diagram of a distributed battery management system according to the present disclosure.

Referring to FIG. 1, a plurality of battery packs are connected in series in a high-voltage power circuit. The master module 10 is provided in a master box. The high-voltage power circuit goes through the master box. The master module 10 is connected to one end of every battery pack connected in series through a switch S1, and the master module 10 is also connected to the other end of every battery pack connected in series through a switch S2.

Figure 2:
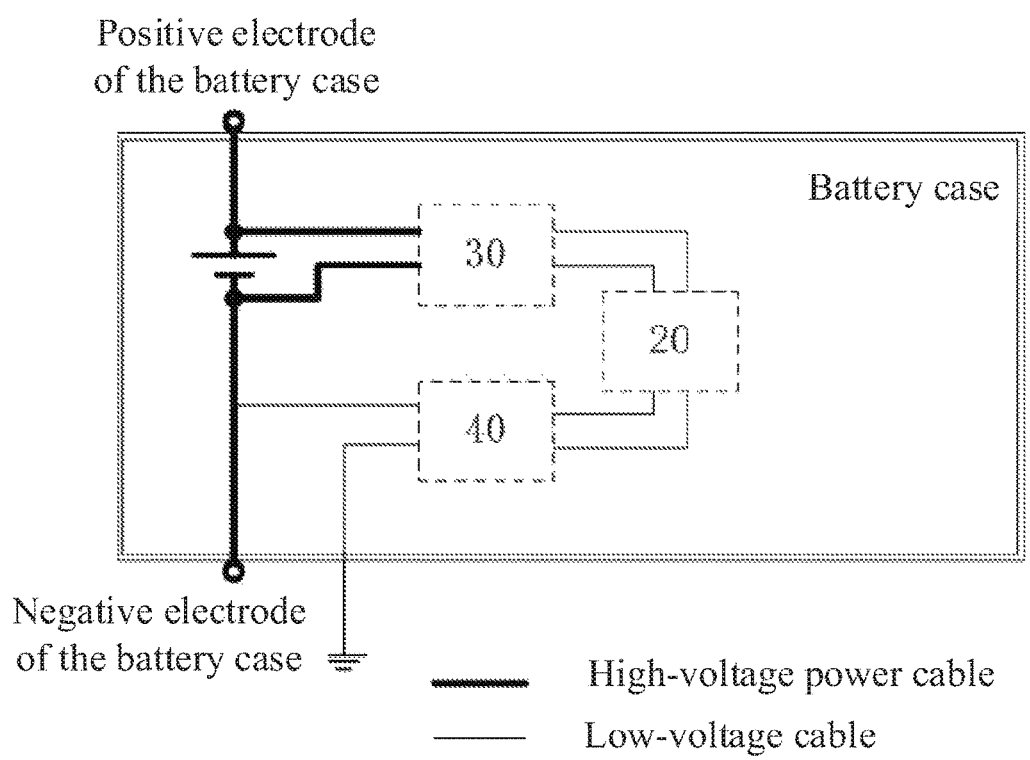
FIG. 2 is a schematic diagram of connection of the slave module in the distributed battery management system according to the present disclosure.

Referring to FIG. 2, each slave module 20 is provided in a same battery case as its corresponding battery pack. The slave module 20 is connected with its corresponding battery pack via a DC/DC converter 30. The DC/DC converter 30 converts a high-voltage direct current of the battery pack into a low-voltage direct current and supplies it to the slave module 20 so as to realize power supply of the slave module 20. The slave module 20 may communicate with the master module 10 via a PLC (Power Line Communication) technology. The slave module 20 has a communication cable connected to the high-voltage power circuit via a PLC modem 40, and another communication cable connected to the housing of the battery case. The housing of the battery case is connected to ground of the entire pure electric vehicle (that is, the housing of the battery case is an object with ground potential). The master module 10 and the slave module 20 use the high-voltage power cable and the object with ground potential as communication media.

Referring to FIG. 1, the master module 10 may detect On-Off state of the high-voltage power circuit and locates a breaker point by controlling opening and closing of the switch S1 and the switch S2.

Assume that the high-voltage power circuit between the battery case 1 and the battery case 2 is disconnected. If the switch S1 is closed and the switch S2 is opened, the master module 10 can communicate with the slave module 20 in the battery case 1, but cannot communicate with the slave modules 20 in the battery cases 2 to N. If the switch S1 is opened and the switch S2 is closed, the master module 10 can communicate with the slave modules 20 in the battery cases 2 to N, but cannot communicate with the slave module 20 in the battery case 1. In such way, it is determined that the breaker point of the high-voltage power circuit is between the battery case 1 and the battery case 2.

Assuming that the high-voltage power circuit between the battery case 3 and the battery case 4 is disconnected and the high-voltage power circuit between the battery case 6 and the battery case 7 is also disconnected. If the switch S1 is closed and the switch S2 is opened, the master module 10 can communicate with the slave modules 20 in the battery cases 1 to 3, but cannot communicate with the slave module 20 in the battery cases 4 to N. If the switch S1 is opened and the switch S2 is closed, the master module 10 can communicate with the slave modules 20 in the battery cases 7 to 20, but cannot communicate with the slave modules 20 in the battery cases 1 to 6. In such way, it is determined that the high-voltage power circuit between the battery case 3 and the battery case 4 is disconnected and the high-voltage power circuit between the battery case 6 and the battery case 7 is also disconnected.

In connection with the above detailed descriptions of the present disclosure, it can be seen that the distributed battery management system of the present disclosure has at least the following beneficial technical effects relative to the prior arts.

Firstly, the communication between the master module and the slave module is implemented by a high-voltage power cable of the battery pack, so the slave module is able to get power directly from its proximity without the need of the traditional low-voltage communication and power supply wire harnesses, so that complexity of wiring can be reduced and voltage drop due to a long-distance trace of the low-voltage wire harness and damages of low-voltage devices due to multiple connection nodes can be avoided. Thus, the communication and power supply reliability of the battery management system can be significantly improved.

Secondly, by connecting the slave module to the power cable circuit, it is able to provide a two-way backup loop for communication lines, and provide double guarantee for communication interruption caused by accidents, and thereby stability of the battery management system can be improved.

Thirdly, since On-Off state monitoring and breaker point positioning are performed effectively and accurately on the high-voltage power circuit by using communication signals, stability of power supply can be ensured.

According to the above-mentioned principle, the present disclosure can also make appropriate changes and modifications to the above-described embodiments. Accordingly, the present disclosure is not limited to the specific embodiments disclosed and described above, and some modifications and variations of the present disclosure are intended to be included within the scope of the claims of the present disclosure. In addition, although some specific terms are used in this specification, these terms are provided for convenience of illustration only and are not intended to limit the invention in any way.

What is claimed is:

1. A distributed battery management system, comprising:
a master module and at least one slave module,
wherein each slave module manages a corresponding battery pack, the battery pack being connected in series in a power circuit through a power cable, and
wherein the master module and each slave module are respectively connected in the power circuit through the power cable, and the master module can communicate with the slave module through the power cable,
wherein the master module is connected to the positive electrode of the first battery pack of battery packs connected in series through a first switch of the master module, and the master module is connected to the negative electrode of the last battery pack of battery packs connected in series through a second switch of the master module,
wherein when the first switch is closed and the second switch is opened, the master module communicates with one or more slave modules before a breaker point of the power cable among the at least one slave module in a direction from a first battery pack to a last battery pack, and when the first switch is opened and the second switch is closed, the master module communicates with one or more slave modules after the breaker point in the direction.

2. The distributed battery management system according to claim 1, wherein the slave module is powered by the corresponding battery pack managed by the slave module.

3. The distributed battery management system according to claim 2, wherein each battery pack converts a high voltage to a low voltage through a DC/DC converter and outputs the low voltage to a corresponding slave module.

4. The distributed battery management system according to claim 1, wherein the slave module and the corresponding battery pack are provided in a battery case, and the housing of the battery case has a ground potential.

5. The distributed battery management system according to claim 4, wherein the master module and the slave module use the power cable and the housing of the battery case with ground potential as communication media.

6. The distributed battery management system according to claim 4, wherein the slave module has a communication cable connected to the power circuit and another communication cable connected to the housing of the battery case.

7. The distributed battery management system according to claim 6, wherein the slave module is connected in the power circuit via a Power Line Communication (PLC) modem.

8. The distributed battery management system according to claim 1, wherein the master module is provided in a master box, and the power circuit goes through the master box.

\* \* \* \* \*